(12) United States Patent
Rabenstein et al.

(10) Patent No.: US 8,576,183 B2
(45) Date of Patent: Nov. 5, 2013

(54) DEVICES AND METHODS FOR CONTROLLING BOTH LED AND TOUCH SENSE ELEMENTS VIA A SINGLE IC PACKAGE PIN

(75) Inventors: Arno Rabenstein, München (DE); Sze Main Wong, Serangoon (SG)

(73) Assignee: Infineon Technologies AG, Neubiberg (DE)

(*) Notice: Subject to any disclaimer, the term of this patent is extended or adjusted under 35 U.S.C. 154(b) by 586 days.

(21) Appl. No.: 12/565,192

(22) Filed: Sep. 23, 2009

(65) Prior Publication Data

US 2011/0069013 A1  Mar. 24, 2011

(51) Int. Cl.
*G06F 3/041* (2006.01)
*G09G 3/32* (2006.01)

(52) U.S. Cl.
USPC .......................................................... 345/173

(58) Field of Classification Search
None
See application file for complete search history.

(56) References Cited

U.S. PATENT DOCUMENTS

| 4,394,653 | A | 7/1983 | Breeze | |
|---|---|---|---|---|
| 4,998,119 | A | 3/1991 | Collins | |
| 5,920,309 | A | 7/1999 | Bisset | |
| 7,148,910 | B2 * | 12/2006 | Stauffer et al. | 347/239 |
| 7,432,991 | B1 * | 10/2008 | Chang et al. | 348/739 |
| 2007/0024213 | A1 | 2/2007 | Shteynberg | |
| 2008/0007533 | A1 | 1/2008 | Hotelling | |
| 2008/0291177 | A1 | 11/2008 | Kuo | |
| 2009/0033243 | A1 | 2/2009 | Gater | |
| 2009/0174686 | A1 | 7/2009 | Jeon | |

FOREIGN PATENT DOCUMENTS

| CN | 1700161 A | 11/2005 |
|---|---|---|
| CN | 101398730 A | 4/2009 |
| WO | WO2008/066237 A1 | 6/2008 |

OTHER PUBLICATIONS

*JustDIY Project Log: LEDs As Sensors: Revisted*, available at http://projects.dimenson-x.net/archives71 on Feb. 11, 2010, 8 pages.
*LED Touch Sensing: Multi-Touch Sensing through LED Matrix Displays-Using an LED display bidirectionally to optically detect finer touches*, available at http://www.cs.nyu.edu/~jhan.ledtouch/index.html on Feb. 8, 2010, 1 page.
*Touch Sensing Applications: mTouch™ Sensing Solutions Design Center*, available at www.microchip.com/stellent/idcplg?IdService=SS_GET_PAGE&nodeID=2599 on Feb. 8, 2010, 2 pages.

(Continued)

*Primary Examiner* — K. Wong
(74) *Attorney, Agent, or Firm* — Patterson Thuente Pedersen, P.A.

(57) ABSTRACT

Devices and methods for minimizing a number of I/O pins needed to control LED and touch sense operations are described and disclosed herein. In an embodiment, a method comprises controlling at least one light emitting diode (LED) element via a single pin, and controlling at least one touch sense element via the single pin. In an embodiment, a touch-sensitive light emitting diode (LED) display device comprises at least one LED element, at least one touch sense element, and a controller integrated in an integrated circuit (IC) and coupled to the at least one LED element and the at least one touch sense element via a single pin. The controller is configured to communicate via the pin with the at least one LED element and the at least one touch sense element.

25 Claims, 12 Drawing Sheets

(56) References Cited

OTHER PUBLICATIONS

Shrivasta, Anshu, *Leadis Technology Intros TapTouch Solution*, available at http://www.tmcnet.com/scripts/print-page.aspx?PagePrint=http%3a%2f%2fit.tmcnet.com%2ftopics%2fit%2farticles%2f 46162-leadis-technology-intros-taptouch-solution.htm, Nov. 25, 2008, 2 pages.

*Unlimited Touch, Unlimited Product Possibilities*, available at www.atmel.com/products/touchscreens/default.asp on Feb. 8, 2010, 1 page.

Chinese Application No. 201010506483.4, filed Sep. 26, 2010, Chinese Search Report, mailed Jun. 28, 2013, 3 pages.

\* cited by examiner

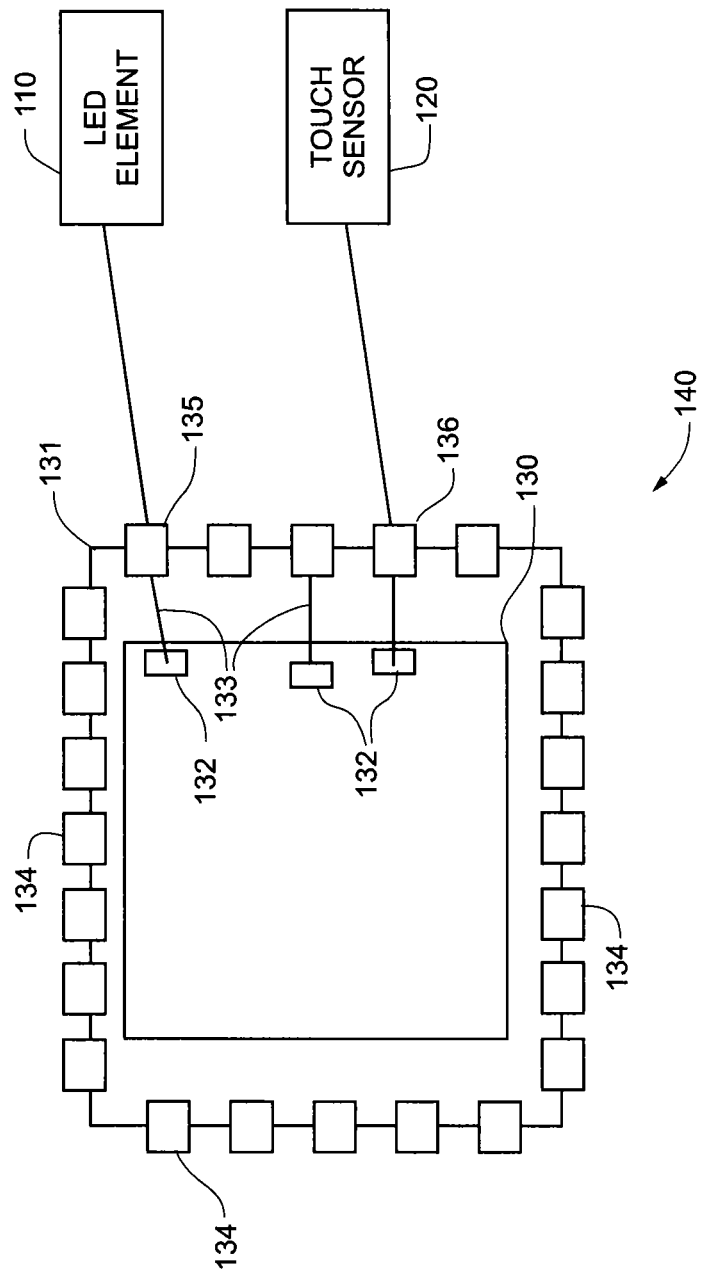

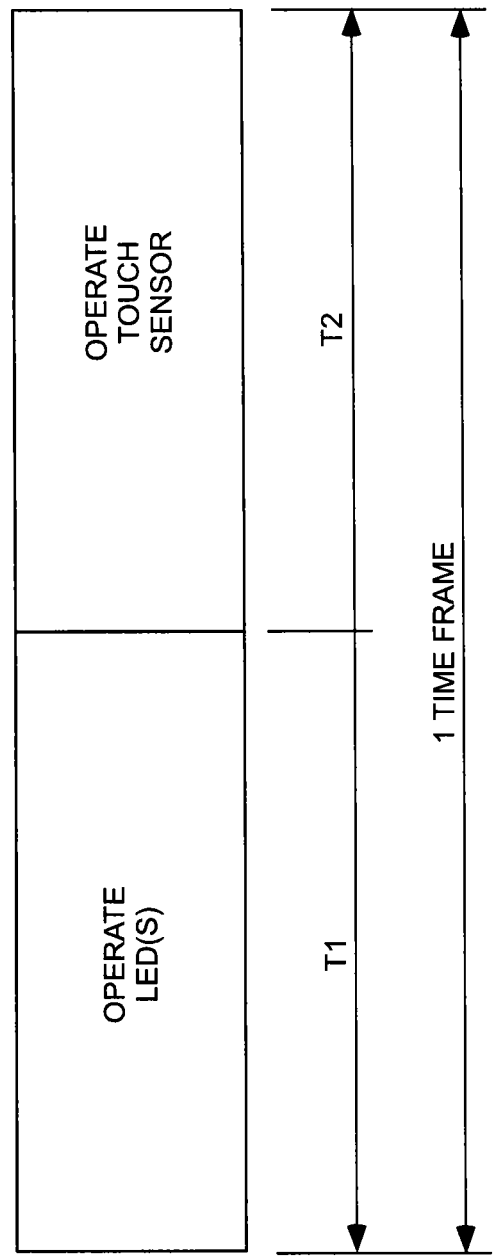

Fig. 6
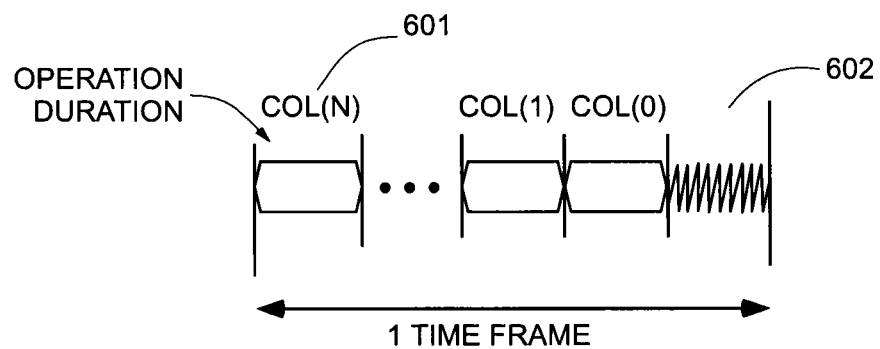
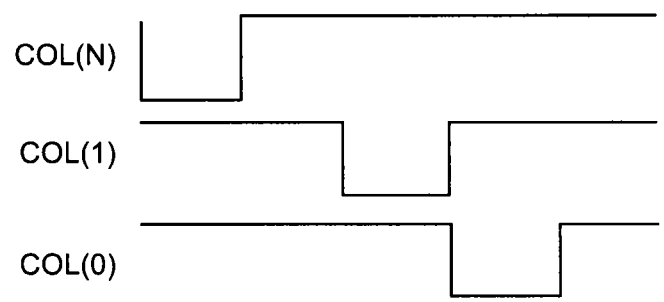

DEVICES AND METHODS FOR CONTROLLING BOTH LED AND TOUCH SENSE ELEMENTS VIA A SINGLE IC PACKAGE PIN

FIELD OF THE INVENTION

The invention relates generally to touch-sensitive display devices and, more particularly, to IC-based controller circuitry adapted to operate touch sense and display circuitry of a display device, such as an LED display device.

BACKGROUND OF THE INVENTION

Touch-sensitive displays have become commonplace in today's electronic devices. For example, many of today's cellular telephones, mp3 players, laptops, office equipment, ATM machines, credit card readers, and even kitchen electronics include touch-sensitive displays that both communicate visual information and allow a user to actuate device functions via touch based commands communicated through interaction with the display.

A typical touch-sensitive display device includes a matrix of LED (light-emitting diode) elements. These elements may be selectively activated by controller circuitry to portray images on the display. Other touch-sensitive display devices include liquid crystal displays (LCDs), plasma and the like.

Known touch-sensitive display devices also include touch sense elements operable to detect one or more objects, such as a finger or stylus, at or near a display, and communicate information related to object detection to a controller for processing. The controller may then operate functions of the display device based on the received information.

One typical type of touch sense element is a capacitive touch sense element. Generally speaking, whenever two electrically conductive members come in proximity with one another, their respective electric fields interact and cause a measurable capacitance. A capacitive touch sense element is constructed to detect capacitance formed at or near (e.g. an edge of a display) a surface of a display by the placement of a finger or stylus in proximity or contact with the screen. Many other technologies also enable touch-sensitive actuation of a display, including: resistive, infrared, surface acoustic wave, electromagnetic, and near field imaging technologies, among others.

As previously mentioned, many known touch-sensitive display devices incorporate some form of an electronic controller to operate LED elements, touch sense elements, or other functions. Typically, such a controller is provided in the form of an Integrated Circuit (IC) device, for example a device that includes an Application Specific Integrated Circuit (ASIC) or a Field Programmable Gate Array (FPGA). Such an IC device typically includes at least one semiconductor die provided in an IC package. The die includes a multitude of interconnected IC components such as transistors, capacitors, resistors, and the like that make up the electrical circuits of the IC. The IC package includes multiple input/output (I/O) pins that allow electrical connection to these circuits to enable functions of the die to be utilized. One significant limitation on the usefulness of an IC device is that, in order to meet size requirements, many ICs present a limited number of I/O pins at an exterior of the device.

Known touch-sensitive LED devices require at least one dedicated I/O pin of an IC-based controller to control each of LED and touch sense operations. As such, there is a need for improvements in touch-sensitive LED display devices.

SUMMARY OF THE INVENTION

Devices and methods for minimizing a number of I/O pins needed to control display and touch sense operations are described and disclosed herein. In an embodiment, a method comprises controlling at least one light emitting diode (LED) element via a single pin, and controlling at least one touch sense element via the single pin. In one embodiment, controlling the at least one LED element includes controlling during a first time period controlling the at least one touch sense element includes controlling during a second time period distinct from the first time period. In another embodiment, a method comprises sequentially controlling at least one light emitting diode (LED) element of each of N LED element arrangements via a single pin, and controlling at least one touch sense element via the single pin. In one embodiment, sequentially controlling includes sequentially controlling during a first time period, and controlling the at least one touch sense element includes controlling during a second time period distinct from the first time period.

In an embodiment, a controller comprises a pin coupled to at least one light-emitting diode (LED) element and at least one touch sense element, wherein the controller is integrated in an integrated circuit (IC) and configured to communicate via the pin with the at least one LED element and the at least one touch sense element to control a touch-sensitive LED display device.

In another embodiment, a touch-sensitive light emitting diode (LED) display device comprises at least one LED matrix including a plurality of LED elements arranged into N columns, at least one first touch sense element, a counter adapted to provide at least one indication of count values of a first count ranging from zero to N+1, and a controller integrated in an integrated circuit (IC) and coupled to the N columns of the LED matrix and the at least one first touch sense element via a first pin and configured to, during a first time period based on a first N count values of the first count, sequentially communicate via the pin with LED elements of each of the N columns and, during a second time period based on an N+1 count value of the first count, communicate via the pin with the at least one first touch sense element.

In an embodiment, a touch-sensitive display device comprises display means for displaying at least one visual indication, detection means for detecting at least one touch-based command, and control means integrated in an integrated circuit (IC) and coupled to the display means and the detection means via a single pin of the IC package for communicating with the display means via the pin and for communicating with the detection means via the pin.

BRIEF DESCRIPTION OF THE DRAWINGS

The invention may be more completely understood in consideration of the following detailed description of various embodiments of the invention in connection with the accompanying drawings, in which:

FIG. 3 depicts generally one example of an integrated circuit device that includes at least one controller.

FIG. 5 depicts generally a timing diagram of a method of operating an LED and touch sense element controller according to one embodiment.

FIG. 6 depicts generally a timing diagram of a method of operating an LED and touch sense element controller according to one embodiment.

Figure 1:
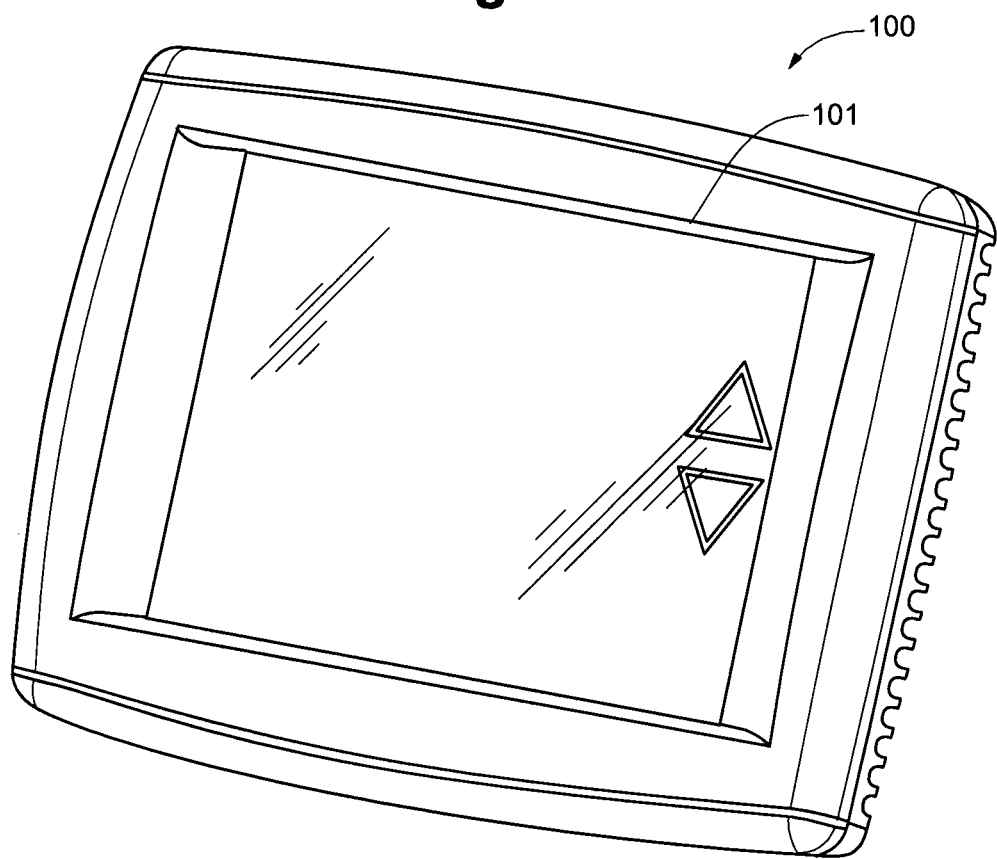
FIG. 1 depicts generally one example of a touch-screen LED display device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

FIG. 1 illustrates generally one example of a touch screen Light Emitting Diode (LED) display device 100. Device 100 is adapted to present to a user, via display 101, one or more visual images. Device 100 may also be adapted to allow a user, by finger or stylus based actuation of display 101, to communicate commands to device 100. In the example shown, display device 100 is presented as a standalone unit and is constructed of a hand-held size. One of skill in the art will recognize that any size or configuration of device 100, including a display device combined with other equipment (e.g. kitchen electronics, a car dashboard, etc.), may also be used. While an LED-type display device is generally described herein, it is exemplary of one embodiment and is not limiting, as other embodiments can utilize or comprise LCD, plasma and other display types and forms.

Figure 2:
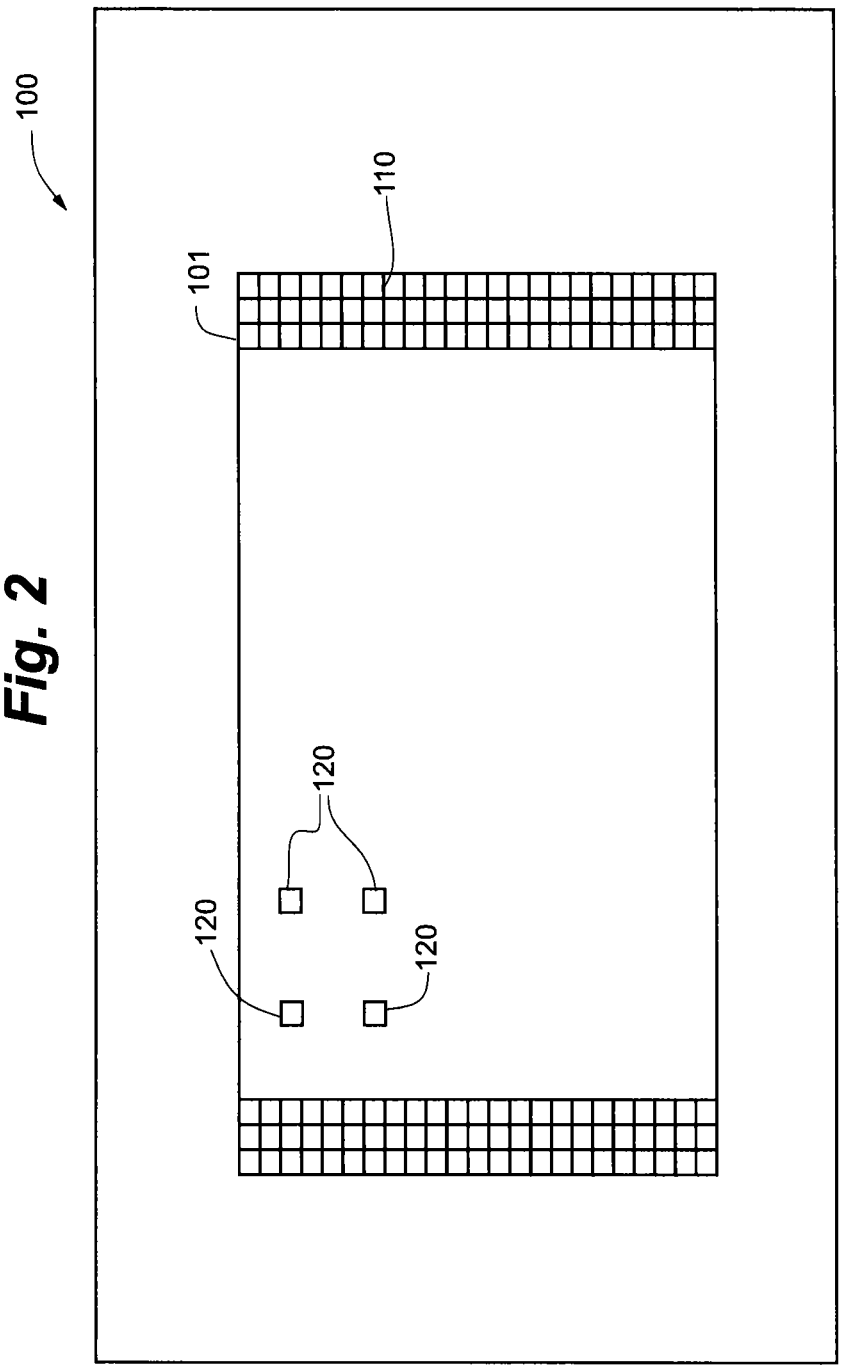
FIG. 2 depicts generally a block diagram of one example of a touch-sensitive LED display device.

FIG. 2 illustrates generally a block diagram of one example of an LED display device 100. At a surface of device 100, an LED display 101 is presented. Display 101 includes a plurality of LED elements 110. LED elements 110 are adapted to emit light to portray images, graphics, or other indicators on display 101. FIG. 1 only shows LED elements 110 at side regions of display 101, however in other LED displays, LED elements 110 are arranged across the entire display 101, or in other configurations.

Each LED element 110 may be adapted to emit any combination of red, blue, green, white, or no light. In order to project an image on display 101, LED elements 110 may be selectively operated by a controller to form different colors, patterns, or images, or to modify an intensity of emitted light.

Display device 100 depicted in FIG. 2 further includes a plurality of touch sense elements 120 in an left upper region of display 101. The embodiment depicted in FIG. 2 only shows touch sense elements 120 in a particular region of display 101, however for a typical display device 100 touch sense elements 120 are arranged at positions across the entire surface of display 101 to enable a user to give touch based commands at any position on or near display 101. Other configurations are also possible. Touch sense elements 120 may incorporate any means for detecting an object in contact or proximity with a display now known or later developed, including capacitive, resistive, infrared, surface acoustic wave, electromagnetic, and near field imaging, among others.

These touch sense elements 120 may be adapted to detect placement, movement, orientation, or other information relating to an object at or near a surface of display 101. One or more controllers of display device 100 may be adapted to receive at least one signal indicating such detection, and control functions of device 100 accordingly. For example, for a Global Positioning System (GPS) display device, a user may, by touching a region of display 101 depicting an indication of a button with the text "Go Home", command the GPS unit to give the user directions home.

FIG. 3 illustrates generally one example of at least one controller 140 integrated in an integrated circuit (IC) device. A typical IC device includes at least one semiconductor die 130 that includes a multitude of semiconductor device structures, such as transistors, resistors, capacitors, and the like, that make up circuits adapted to process information and perform computational functions of controller 140. Typically, IC devices such as controller 140 include a die 130 provided in an IC package 131 constructed to house die 130 for purposes of protection from the environment. IC package 131 may further provide a mountable structure for die 130 and present a plurality of I/O pins 134-136 that enable electrical connections between circuits of die 130 and external devices.

For electrical connection purposes, die 130 includes a plurality of pads 132 presented at one or more surfaces of die 130. Pads 132 provide a contact point to enable electrical connection to internal components of die 130. Typically, die 130 is housed in package 131, and pads 132 are electrically connected to pins 134-136 through wire bonds 133. This arrangement allows for electrical connection of external components to reach interior circuitry of die 130 without undesirably exposing die 130 to the elements or other harmful conditions.

As shown in FIG. 3, pins 135 and 136 are electrically connected to other components, in this case pin 135 is electrically coupled to an LED element 110, and pin 136 is electrically coupled to a touch sensor element 120. Because there are a limited number of pins 134-136 provided on a typical IC package such as package 131, it is advantageous to utilize as few pins as possible for any given function of IC device 140. As such, it is desired to minimize the number of pins 134-136 needed to control both LED 110 and touch sense 120 components of a touch-sensitive display device 100.

Figure 4A:
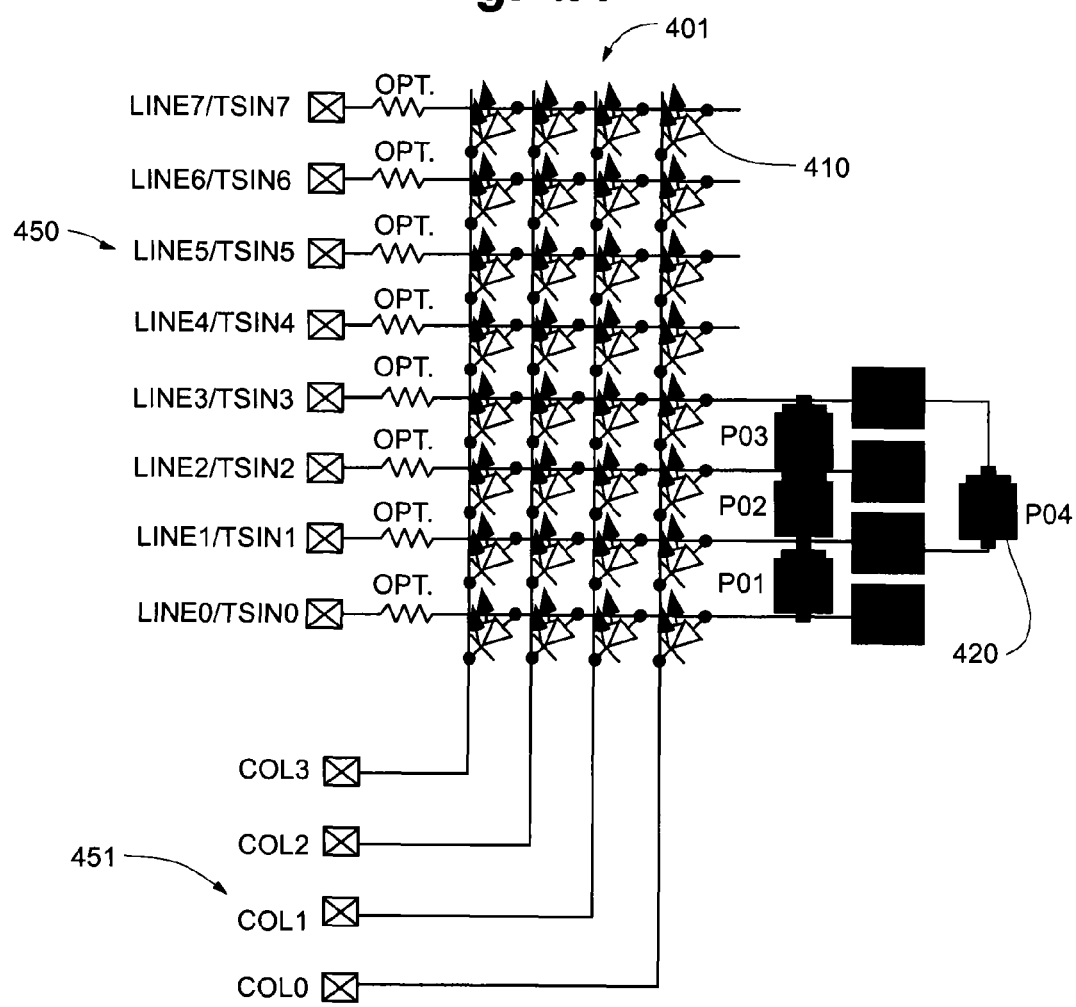
FIG. 4A depicts generally an LED element matrix and a plurality of touch sense element according to one embodiment.

FIG. 4A illustrates generally an LED element matrix 401 coupled to touch sense elements 420 according to one embodiment. As shown, matrix 401 includes a plurality of individual LED elements 410. Each LED element 410 may include multiple LEDs adapted to emit light of different colors or of different intensity. For example, each LED element 410 may include respective LEDs adapted to emit red, green, blue, and white light. In the alternative, LED elements 410 may include one or more LEDs adapted to emit light of a range of colors. LED elements 410 may also include only one LED of a particular color.

As shown in FIG. 4A, LED elements 410 may be grouped in a series of LED element arrangements, in this case the arrangements are columns and rows. In order to present an image at display 101 of LED device 100, LED elements 410 are controllable by a controller to turn on or off, to hold a state, to emit light of different combinations of colors, or to modify an intensity of emitted light.

In the embodiment illustrated in FIG. 4A, LED matrix 401 includes LED element arrangements of eight rows and four columns of LED elements 410, and touch sense elements 420 are coupled to four rows [LINE0:LINE3] of LED matrix 401. One of skill in the art will recognize that any number of LED columns or LED rows may be used in various embodiments. One of skill will further recognize that any number of touch sense elements 420 may be coupled to any number of LED element arrangements, such as columns or rows, of an LED matrix.

LED matrix 401 further includes a plurality of row connections 450 and column connections 451. These connections 450 and 451 may each be operably coupled to one or more package pins of an IC based controller to control LED elements 410 and/or touch sense elements 420.

According to various embodiments, at least one LED element 410 of LED matrix 401 and at least one touch sense element 420 may be operated by a controller via a single I/O pin of an IC based controller in a time-multiplexed fashion. For example, a controller may include a clock, counter, or other time-based module. Based at least in part on an output of the time-based module, the controller may operate one or more LED elements 410 of a particular row, or particular column of matrix 401, or one or more touch sense elements 420, via a single I/O pin. For example, during a first time period, the controller may operate one or more LED elements 410 of LED matrix 401. During a second time period, the controller may operate one or more touch sense elements 420. During a third time period, the controller may operate one or more LED elements 410 of LED matrix 401, and so on.

A controller may be adapted to sequentially operate based on both rows and columns of LED matrix 401. In an embodiment, the controller may, during a first time period, operate an LED element 410 at column three, line zero. During a second time period, the controller may operate an LED element 410 at column two, line zero. After operating LED elements 410 at columns one and zero, during a fifth time period, the controller may operate at least one touch sense element 420. During a subsequent time period, the controller may operate at LED element at column three, line one, and so on.

Figure 4B:
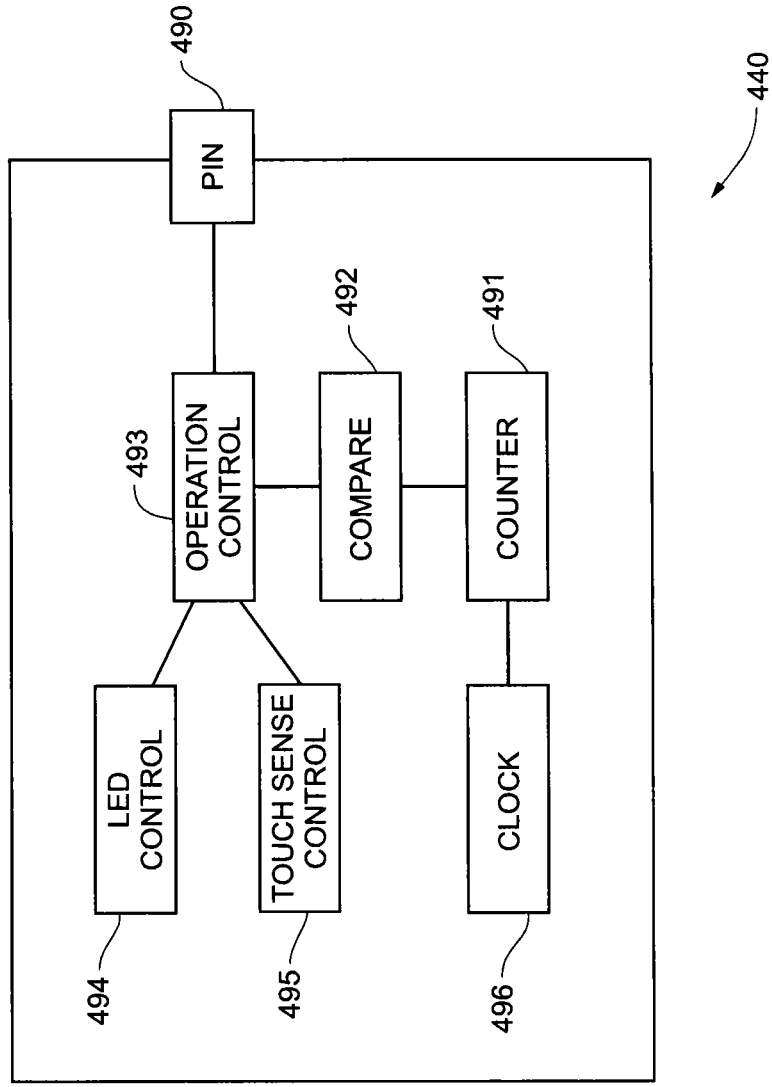
FIG. 4B depicts generally a block diagram of one embodiment of a controller according to one embodiment.

FIG. 4B illustrates generally a block diagram of one embodiment of a LED display device controller 440 according to one embodiment. Controller 440 includes LED control module 494 and touch sense control module 495. In an embodiment, LED control module 494 is adapted to communicate with one or more LED elements 410 to control operation of the one or more LED elements 410 to turn on or off LEDs, emit different colors, or to change an intensity of light emitted. In an embodiment, touch sense control module 495 is adapted to communicate with at least one touch sense element 420 to enable detection of touch based commands. Touch sense control module 495 may include an oscillation control module and a counter module (not shown). In an embodiment, the counter module is adapted to count a number of oscillations of the oscillations module to detect whether a touch has occurred.

In an embodiment, controller 440 further includes an operation control module 493 coupled to I/O pin 490. In various embodiments, operation control module 493 is adapted to selectively enable LED control module 494 to communicate with at least one LED element 410 or to enable touch sense control module 495 to communicate with at least one touch sense element 420.

In an embodiment, controller 440 further includes at least one compare module 492, at least one counter module 491, and at least one clock module 496. In an embodiment, the at least one counter module 491 is constructed to provide to compare module 492 at least one indication of a count value. A count value may change at times based on a clock signal defined by clock module 496. While the embodiment of FIG. 4B shows clock module 496 as part of controller 440, clock module 496 (or any other module discussed herein) may be located off-chip, and controller 440 may be adapted to receive a clock signal from another electronic device in other embodiments. Also, in an embodiment not depicted, controller 440 may include at least one time shifting module constructed to scale (speed up or slow down) a clock pulse signal provided by clock module 496.

In one embodiment, the indication of a count value provided by counter module 491 is a binary number. In an embodiment, compare module 492 is adapted to receive from counter module 491 the binary number, and compare this binary number to one or more stored values to determine an operating state of controller 440 with respect to pin 490.

In an embodiment, compare module 492 is adapted to provide, to operation control module 493, an indication whether operation control module 493 should enable communication between LED control module 494 and at least one LED element 410 via pin 490, or enable communication between touch sense control module 495 and at least one touch sense element 420 via pin 490.

In the embodiment depicted in FIG. 4B, LED control module 494, touch sense control module 495, clock module 496, operation control module 493, compare module, 492, and counter 491 are illustrated as separate and distinct modules of controller 440. One of skill in the art will recognize, however, that these modules may be realized alone or in combination in any implementation in various other embodiments. For example, compare module 492 and operations control module 493 may take the form of a demultiplexer circuit as known in the art. The demultiplexer may be adapted to receive a binary number from counter module 491, and based on this value enable communication with one or more LED elements 410 or one or more touch sense elements 420 as discussed herein. Further, one of skill in the art will recognize that modules 491-496 may be realized via hardware, software, firmware, or any combination of hardware, software, or firmware.

FIG. 5 illustrates generally a timing diagram of a method of operating an LED display device controller 440 according to one embodiment. As shown, controller 440 is adapted to selectively control operation of one or more LED elements 410 and one or more touch sense elements 420 via a single IC controller package pin 490.

Comparator 492 may be adapted to determine at least one operation duration such as durations T1 and T2 as illustrated in FIG. 5. Operation control module 493 of controller 440 may be adapted to selectively control which functions of controller 440 are enabled during a particular operation duration. For example, as illustrated in FIG. 5, operation control module 493 may be adapted to enable LED control module 494 to communicate with at least one LED element 410 during duration T1, and to enable touch sense control module 495 to communicate with at least one touch sense element 420 during duration T2.

As discussed above, the embodiment illustrated in FIG. 5 is advantageous because, through time-multiplexing, controller 440 is constructed to selectively operate both LED circuitry and touch sense circuitry via a single pin, thus reducing utilization of package pins of a controller IC 440. Because of this, pins of an IC controller package that would have been dedicated to LED or touch sense control in a known display device 100 may be utilized for other purposes, thus improving a display device designer's ability to improve size and functionality aspects of display device 100. For example, in order to operate the 32 LED elements 410 and 4 touch sense elements 420 depicted in FIG. 4. without the instant invention, a minimum of 12+4 pins would be needed. However, according to the invention described herein, only 12 pins are needed to control the LED elements 410 and touch sense elements 420 depicted in FIG. 4.

FIG. 6 illustrates generally a timing diagram of a method of operating a controller 440 of a display device 100 according to one embodiment. As depicted, display device 100 includes an LED matrix that includes N arrangements of LED elements 420. In the depicted embodiment, the N arrangements are N columns of LED elements 420. As discussed above, controller 440 may include a timer, counter, clock, and/or compare module or other means for defining at least one time frame and at least one operation duration within the time frame.

In an embodiment, counter 491 is adapted to provide a number of count values ranging from N+1 to 0 (or in the alternative from 0 to N+1), where N is a number of LED element arrangements such as columns of an LED matrix. As depicted, based on at least one indication from compare module 492, operation control module 493 is adapted to enable LED control module 494 to sequentially communicate via pin 490 with at least one LED element 410 of each of the N columns for operation durations 601 defined by the first N count values output by counter 491. When compare module 492 receives a value of 0 (or in the alternative a value of N+1 if counting from 0 to N+1) from counter module 491, operation control module 493 is adapted to, during operations duration 602, enable touch sense control module 495 to communicate with one or more touch sense elements 420 to determine whether a user has provided a command to display device 100 via touch.

In an embodiment, operation control module 493 is adapted to enable LED control module 494 or touch sense control module 495 to communicate with at least one LED element 410 or at least one touch sense element 420 a single time for each operations duration. In other embodiments, operation control module 493 is adapted to enable LED control module 494 or touch sense control module 495 to communicate with at least one LED element 410 or at least one touch sense element 420 multiple times during one or more operations durations. For example, LED control module 494 may be operative to modify a state of one or more LED elements 410 multiple times during each operations duration. Likewise, touch sense control module 495 may be adapted to operate one or more touch sense elements 420 multiple times during a single operations duration.

Further, time multiplexing described herein is based on an N+1 counter, wherein operations control module 493 is adapted to communicate with LED elements 410 during a first N operations durations, and to communicate with at least one touch sense element during an N+1 operations duration, where N is a number of columns of an LED matrix. In other embodiments, instead of an N+1 counter, an N+n counter may be employed, where n is a number of desired touch sense element 420 communications in a given time frame. For example, if it is desirable to communicate with at least one touch sense element 420 three consecutive times each time the touch sense element 420 is operated to detect actuation of display 101 (oversampling), an N+3 counter may be employed. As such, operations control module 493 may be adapted to communicate with at least one touch sense element during N+1, N+2, and N+3 operations durations.

Figure 7:
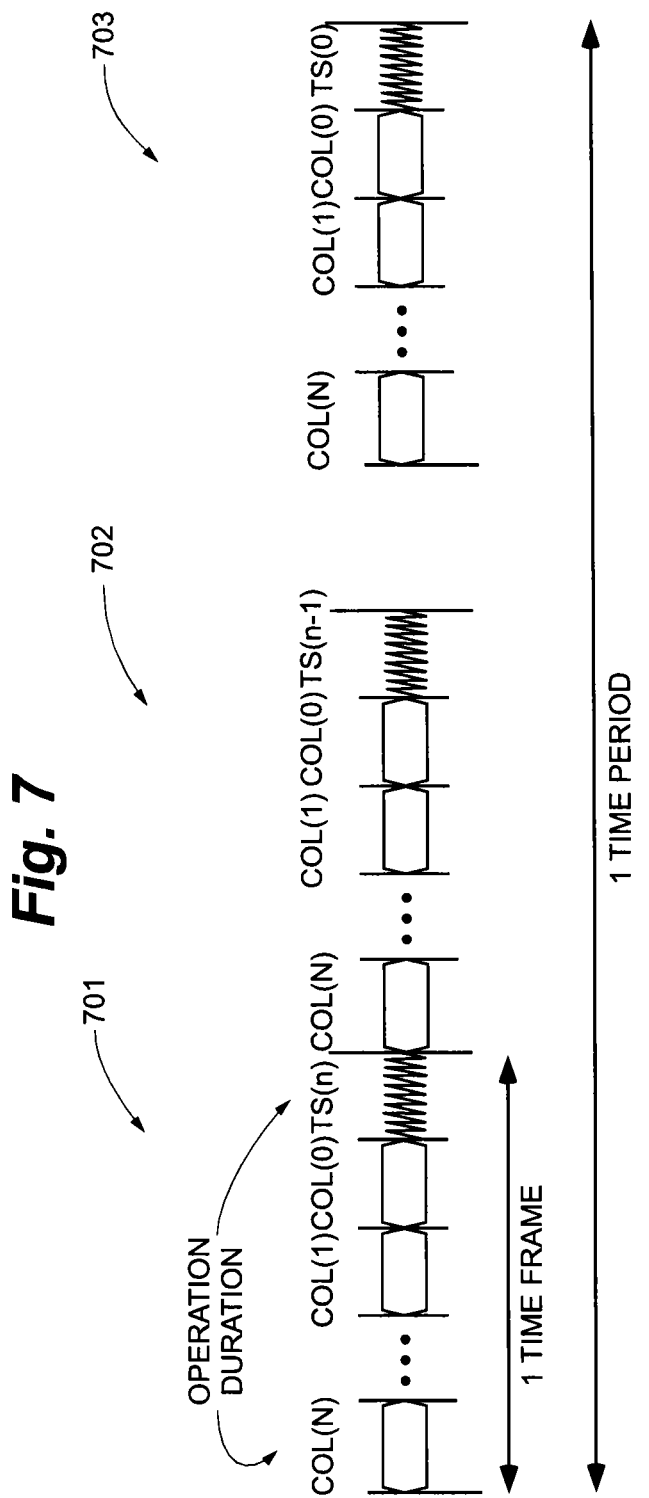
FIG. 7 depicts generally a timing diagram of a method of operating an LED and touch sense element controller according to one embodiment.

FIG. 7 illustrates generally a timing diagram of a method of operating a controller 440 of a display device 100 according to one embodiment. The embodiment depicted in FIG. 7 is similar to that depicted in FIG. 6, except it includes illustration of an entire time period including multiple time frames 701, 702, and 703. As shown, counter module 491 is adapted to count from N+1 down to 0, where N is a number of LED element arrangements such as columns of LED matrix 401 as depicted in FIG. 4A. As shown for time frame 701, during each of the N operation durations defined by counter module 491, operation control module 493 is adapted to enable LED control module 494 to sequentially control columns of LED elements 410. For example, operation control module 493 may enable LED control module 494 to control at least one LED element of column 0 for a counter module 491 count value of 0, and at least one LED element of column 1 for a counter module 491 count value of 1. When compare module 492 indicates that counter module 491 has reached a count value of 0 (or N+1 if counter module 491 is counting up from zero), operation control module 493 is adapted to enable communication between touch sense control module 495 and at least one touch sense element 420 to detect user input during an operation duration defined by the N+1 value of counter module 491. At time frame 702, counter module 491 is reset to an initial value (N+1), and begins counting down to 0 again. Operation control module 493 may then sequentially enable communication with at least one LED element of each of the N columns during the first N count values output by counter module 491. When compare module 492 indicates that counter module 491 has reached a count value of 0 (or N+1 if counter module 491 is counting up from zero), operation control module 493 is adapted to enable communication between touch sense control module 495 and at least one touch sense element 420 to detect user input during an operation duration defined by the N+1 value of counter module 491.

In an embodiment, controller 440 may further include a second counter (not depicted in FIG. 4B) to provide an indication of what time frame is associated with a current operation. For example, a second counter may define which line of lines L0:L7, or which touch sense element 420, a particular time frame is associated with.

Figure 8:
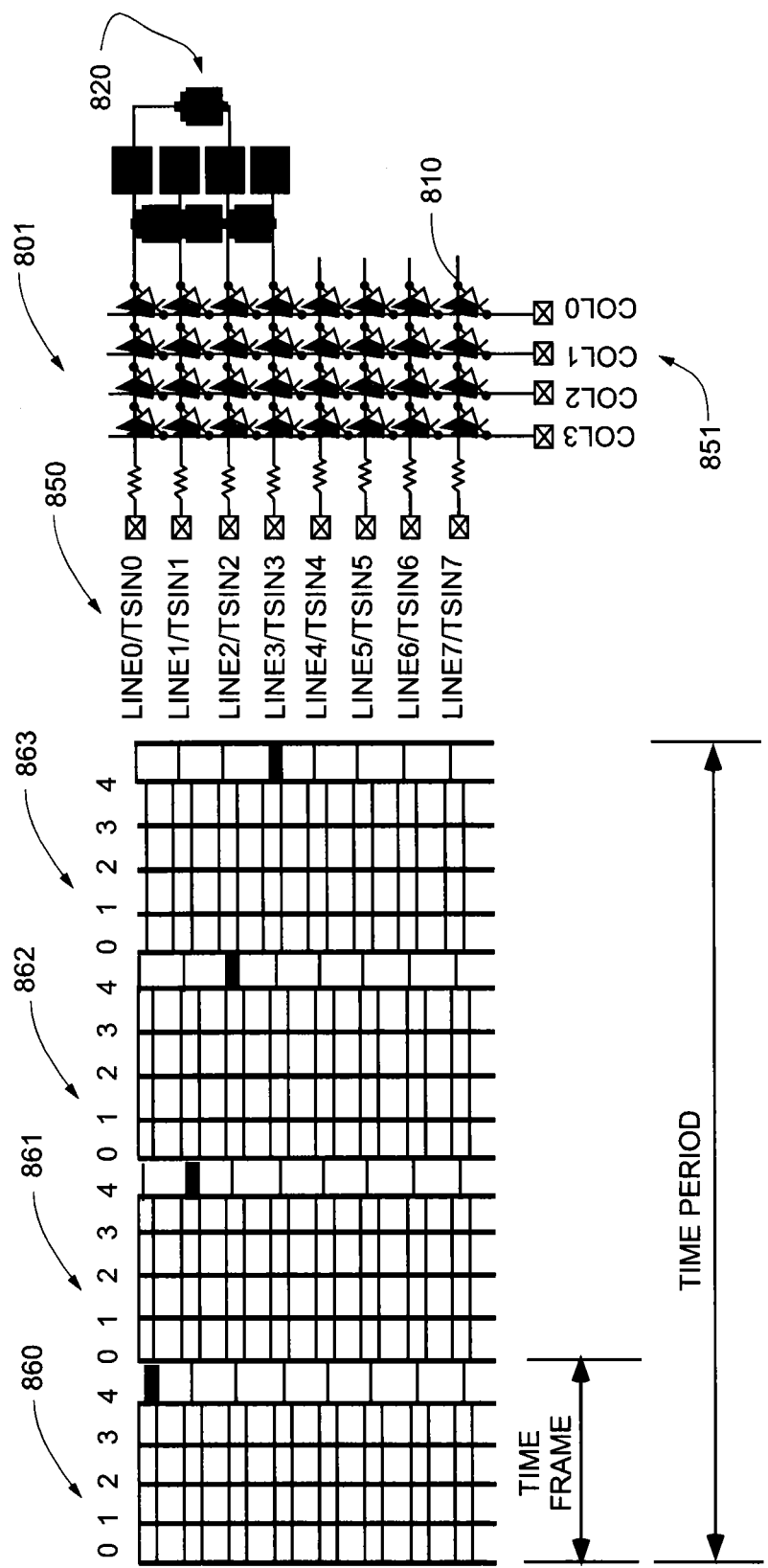
FIG. 8 depicts generally a timing diagram of a method of operating an LED and touch sense element controller and an LED element matrix and a plurality of touch sense elements according to one embodiment.

FIG. 8 illustrates generally a method of operating a controller 440 to control LED elements 810 of LED matrix 801 and touch sense elements 820 according to one embodiment. As shown, column connections 851 enable a controller 440 to selectively operate LED elements 810 or touch sense elements 820 coupled to columns 0-4, and row connections enable controller 440 to selectively operate LED elements 810 or touch sense elements 820 coupled to rows (lines) 0-7 of LED matrix 801.

According to the embodiment of FIG. 8, LED matrix 801 includes LED element arrangements of N=4 columns, and counter module 491 is adapted to provide count values from 0-4 (N+1=5). For time frame 860, counter module 491 is operable to define, via compare module 492, five operation durations based on the count values. During the first four operation durations (0-3), operation control module 493 is adapted to enable communication between LED control module 494 and at least one LED element 820 of respective LED columns 0-3. During the fifth (4) operation duration, or the N+1 operation duration, operation control module 493 is adapted to enable communication between touch sense control module 495 and at least one touch sense element 820 coupled to line 0 of LED matrix 801.

At time frame 861, counter module 491 then resets to an initial value (0), and compare module 492 indicates to operation control module 493 to again sequentially enable communication between LED control module 494 and at least one LED element 810 of respective LED columns 0-3. During a fifth operation duration of time frame 861, operation control module 493 may enable communication between touch sense control module 495 and at least one touch sense element 820 coupled to row (line) 1 of LED matrix 801. At time frames 862 and 863, operations control module 493 may be adapted to again sequentially enable communication between LED control module 494 and at least one LED element 810 of respective LED columns 0-3. At a fifth operation duration of time frames 862 and 863, operation control module 493 may enable touch sense control module 495 to communicate with touch sense elements coupled to lines 2 and 3, respectively. Controller may then repeat the above described operations beginning at time frame 861.

In the depicted embodiment, operational control module 493 is adapted to, during each of the first four operation durations of a time frame, enable communication with LED elements 810 according to columns (columns 0-3) of LED element arrangements. Operational control module 493 may further be adapted to, during each time frame, sequentially enable communication with LED elements 810 according to rows of LED element arrangements. For example, during time frame 860, operational control module 493 may sequentially enable communication between LED control module 494 and LED elements of columns 0-3 and row (line) 0. Similarly, during time frame 861, operational control module 493 may sequentially enable communication between LED control module 494 and LED elements of columns 0-3 and row 1, and so on.

The embodiments described thus far are directed primarily to time multiplexing based on LED element arrangements in the form of columns. However, one of skill in the art will recognize that the time-multiplexing based on LED element arrangements in the form of rows may also be used in various embodiments. For example, referring to FIG. 8, where LED matrix includes M=8 lines [0:7], counter module 491 is adapted to count from 0-8 (M+1=9). During a first time frame, for example, counter module 491 may be adapted to define, via compare module 492, nine operation durations. During the first eight operation durations (0-7), operation control module 493 is adapted to enable communication between LED control module 494 and LED elements 820 of respective LED rows 0-7. During the ninth (8) operation duration, or the M+1 operation duration, operation control module 493 is adapted to enable communication between touch sense control module 495 and at least one touch sense element 820.

Various embodiments of time durations for both LED and touch sense operation have been described herein. One of skill in the art will understand that these time durations may be selected to have durations based on human optical recognition. For example, a typical human being is only able to process a display refresh of 20 milli-seconds. Anything faster would be undetectable to the human eye. As such, the time periods discussed herein for LED operation may be selected such that LED elements of a display refresh, or are operated by a controller, at a rate faster than a refresh rate of 20 milli-seconds. With a remaining time for which LED operation would be undetectable to a human eye, touch sense operations are enabled as described herein.

Figure 9:
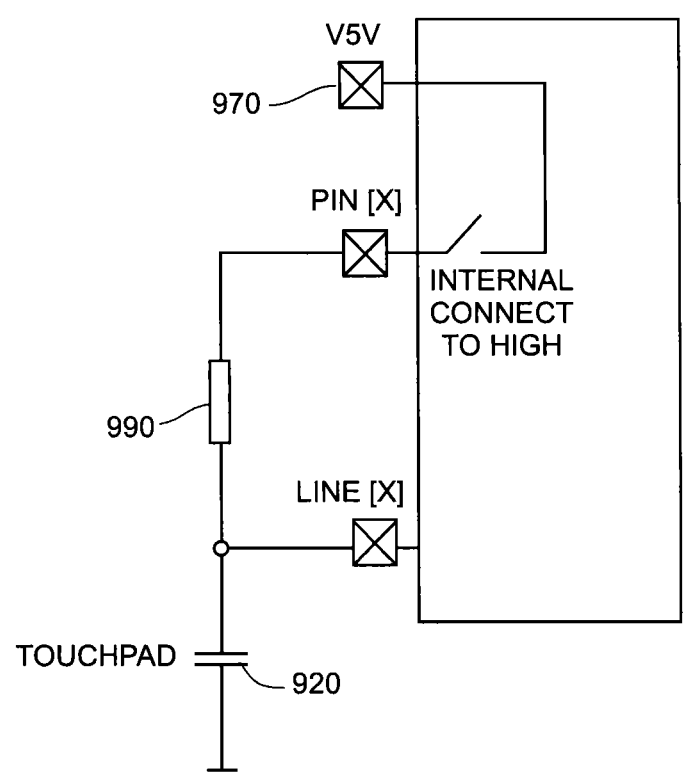
FIG. 9 depicts generally a pull-up resistor configuration according to one embodiment.

FIG. 9 illustrates generally a controller that includes at least one resistor 990 according to one embodiment. In an embodiment, the at least one resistor is a pull-up resistor. In other embodiments in which a the arrangement of touch sense elements is implemented in a high side topology, the resistor may be a pull-down resistor. For embodiments of a display device 100 that are adapted to detect touch using capacitive touch sensing elements, an ability of a touch sense element 120 to detect a capacitance caused by a placement of an object at or near a surface of a display 101 may be improved by operatively coupling a resistor 990 (which may also take the form of one or more transistors adapted to operate as a resistor) between a power supply terminal 970 and a touch sense element 920. In the embodiment depicted where a pull-up resistor is employed, power supply terminal 970 is a positive terminal of a power supply. As such, operation control module 493 may be adapted to, when enabling communication between touch sense control module 495 and at least one touch sense element 920 to detect commands, operably couple one or more touch sense elements 920 to power supply terminal 970 to improve capacitive touch sense capabilities of touch sense element 920. In an embodiment, resistor 990 is an off-chip pull-up resistor.

Figure 10:
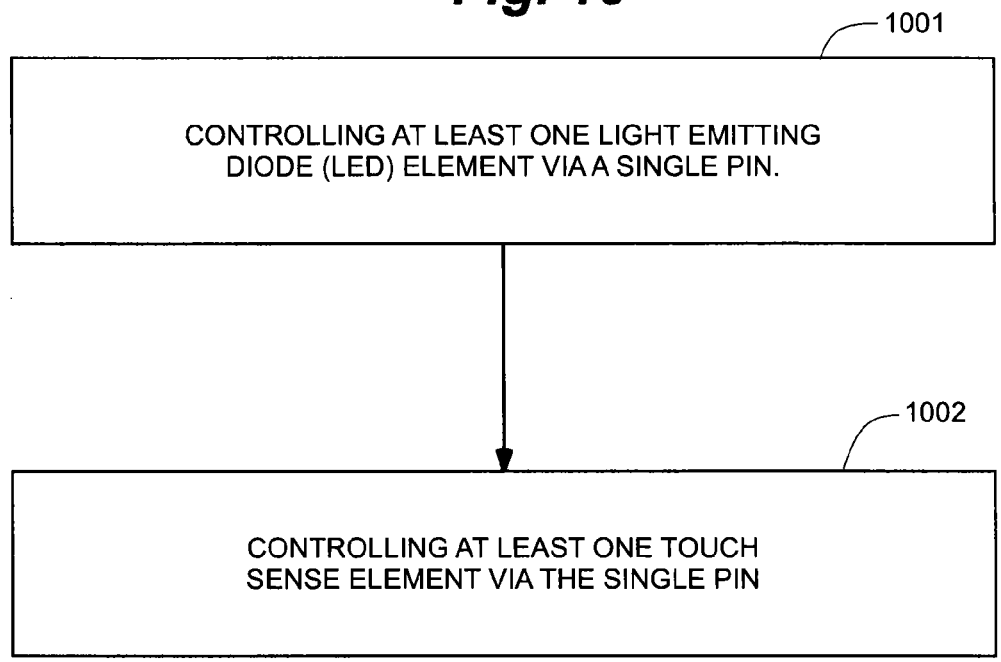
FIG. 10 depicts generally a method of operating a controller according to one embodiment.

FIG. 10 illustrates generally one embodiment of a method of operating at least one LED or other display element and at least one touch sense element according to one embodiment. At 1001, at least one LED element is controlled via a single pin. At 1002, at least one touch sense element is controlled via the pin. In an embodiment, the at least one LED element is controlled during a first time period, and the at least one touch sense element is controlled during a second time period distinct from the first time period.

Figure 11:
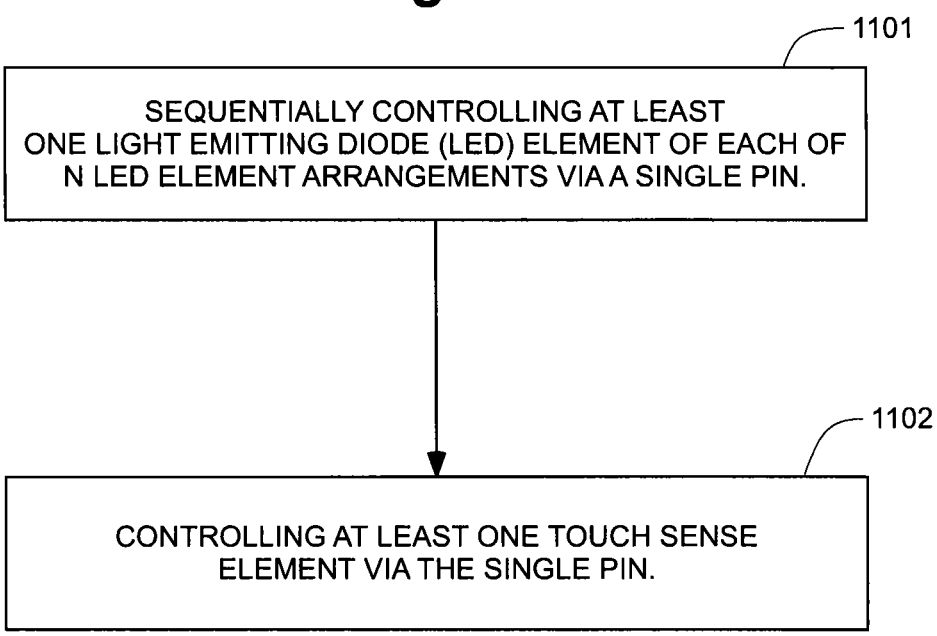
FIG. 11 depicts generally a method of operating a controller according to one embodiment.

FIG. 11 illustrates generally one embodiment of a method of controlling at least one LED element and at least one touch sense element of a touch-sensitive LED display device according to one embodiment. At 1101, a least one LED element of each of N LED element arrangements are sequentially controlled via a single pin. In an embodiment, the N LED element arrangements are N columns of an LED matrix. In another embodiment, the N LED element arrangements are N rows of an LED matrix. At 1102, at least one touch sense element is controlled via the pin. In an embodiment, the at least one LED element of each of N LED element arrangements is controlled during a first time period and the at least one touch sense element is controlled during a second time period distinct from the first time period.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, implantation locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method comprising:
   controlling at least one light emitting diode (LED) element via a single input/output pin of a controller, the single input/output pin coupled to the at least one LED element; and
   controlling at least one touch sense element via the single input/output pin of the controller, the single input/output pin coupled to the at least one touch sense element.

2. The method of claim 1, wherein controlling the at least one LED element includes controlling during a first time period; and wherein controlling the at least one touch sense element includes controlling during a second time period distinct from the first time period.

3. The method of claim 2, further comprising:
   defining the first time period and the second time period based on at least one count value of a counter.

4. The method of claim 3, wherein defining includes defining based on at least one count value of a zero to N+1 counter, where N is a number of LED element arrangements.

5. The method of claim 4, wherein defining includes defining the first time period by a first N count values of the counter and defining the second time period by an N+1 count value of the counter.

6. A method comprising:
   sequentially controlling at least one light emitting diode (LED) element of each of N LED element arrangements via a single input/output pin of a controller coupled to the at least one LED element; and
   controlling at least one touch sense element via the single input/output pin coupled to the at least one touch sense element.

7. The method of claim 6, wherein sequentially controlling includes sequentially controlling during a first time period; and
   wherein controlling the at least one touch sense element includes controlling during a second time period distinct from the first time period.

8. The method of claim 7, further comprising:
   defining the first time period and the second time period based on at least one count value of a counter.

9. The method of claim 8, wherein defining includes defining based on a counter adapted to sequentially count for a range of zero to N+1.

10. The method of claim 9, wherein defining includes defining the first time period based on a first N count values of the counter, and defining the second time period based on an N+1 count value of the counter.

11. A controller comprising:
    an input/output pin coupled to at least one light-emitting diode (LED) element and coupled to at least one touch sense element,
    wherein the controller is integrated in an integrated circuit (IC) and configured to communicate via the input/output pin with the at least one LED element and the at least one touch sense element to control a touch-sensitive LED display device.

12. The controller of claim 11, wherein the controller is housed in an IC package.

13. The controller of claim 12, wherein the input/output pin is a pin of the IC package.

14. The controller of claim 11, wherein the controller is operable to communicate with the at least one LED element during a first time period, and wherein the controller is operable to communicate with the at least one touch sense element during a second time period distinct from the first time period.

15. The controller of claim 14, further comprising at least one counter, wherein the controller is adapted to define the first time period and the second time period based on at least one count value of the counter.

16. The controller of claim 11, wherein the controller is adapted to operably couple the at least one touch sense element to a terminal of a power supply of the IC via at least one resistor during the second time period.

17. The controller of claim 11, further comprising:
    N arrangements of LED elements; and
    at least one N+1 bit counter operable to sequentially communicate with at least one LED element of each of the N arrangements of LED elements during a first N operation durations based on a first N count values of the N+1 bit counter, and communicate with the at least one touch sense element during at least one operations duration based on an N+1 count value of the N+1 bit counter.

18. A touch-sensitive light emitting diode (LED) display device, comprising:
    at least one LED matrix including a plurality of LED elements arranged into N columns;
    at least one first touch sense element;
    a counter adapted to provide at least one indication of count values of a first count ranging from zero to N+1;
    a controller integrated in an integrated circuit (IC) and coupled to the N columns of the LED matrix and the at least one first touch sense element via a first input/output pin and configured to, during a first time period based on a first N count values of the first count, sequentially communicate via the input/output pin with LED elements of each of the N columns and, during a second time period based on an N+1 count value of the first count, communicate via the input/output pin with the at least one first touch sense element.

19. The device of claim 18, wherein the controller is adapted to couple the at least one touch sense element to a terminal of a power supply of the IC via at least one resistor during the second time period.

20. The device of claim 18, wherein the counter is adapted to provide at least one indication of count values of a second count ranging from zero to N+1;
    wherein the controller is operable to, during a third time period based on a first N count values of the second count, sequentially communicate via a second pin with LED elements of each of the N columns of the at least one LED matrix; and during a fourth time period based on an N+1 count value of the second count, communicate via the second pin with the at least one second touch sense element.

21. The device of claim 18, wherein the touch sense element is a capacitive touch sense element.

22. A touch-sensitive display device, comprising:
    display means for displaying at least one visual indication;
    detection means for detecting at least one touch-based command; and control means integrated in an integrated circuit (IC) and coupled to the display means and the detection means via a single input/output pin of the IC package for communicating with the display means via the input/output pin and for communicating with the detection means via the input/output pin.

23. The device of claim 22, wherein the display means includes at least one light-emitting diode (LED) element.

24. The device of claim 22, wherein the display means is one of a light-emitting diode (LED) display or a liquid crystal display (LCD).

25. The device of claim 22, wherein the control means is configured to communicate with the display means during a first time period; and
  wherein the control means is operable for communicating with the detection means during a second time period distinct from the first time period.

* * * * *